United States Patent [19]
Goldberg et al.

[11] Patent Number: 5,359,698
[45] Date of Patent: Oct. 25, 1994

[54] PORTABLE RANDOM ACCESS AUDIO RECORDING AND PLAYBACK APPARATUS

[76] Inventors: Shmuel Goldberg, 39 Tel Tzur Street, Even Yehuda; Geora Oron, 24 Einstein Street, Ra'anana, both of Israel

[21] Appl. No.: 810,880

[22] Filed: Dec. 20, 1991

[30] Foreign Application Priority Data

Dec. 25, 1990 [IL] Israel ............ 96777

[51] Int. Cl.[5] ............ G10L 3/00
[52] U.S. Cl. ............ 395/2.1; 395/2.79
[58] Field of Search ............ 395/2, 2.79, 2.81, 2.1; 381/51–53; 382/10; 434/308; 369/92, 97; 364/443, 449

[56] References Cited

U.S. PATENT DOCUMENTS

| | | | |
|---|---|---|---|
| 4,264,808 | 4/1981 | Owens et al. | 235/379 |
| 4,281,994 | 8/1981 | Dell et al. | 395/2 |
| 4,318,188 | 3/1982 | Hoffmann | 395/2 |
| 4,338,684 | 7/1982 | Dolby et al. | 369/92 |
| 4,348,191 | 9/1982 | Lipsitz et al. | 434/308 |
| 4,360,876 | 11/1982 | Girauit et al. | 364/449 |
| 4,368,988 | 1/1983 | Tahara et al. | 381/51 |
| 4,375,058 | 6/1980 | Bouma et al. | 382/10 |
| 4,389,541 | 6/1983 | Nakano et al. | 381/51 |
| 4,389,639 | 6/1983 | Torii et al. | 340/539 |
| 4,449,198 | 5/1984 | Kroon et al. | 358/342 |
| 4,516,950 | 5/1985 | Berman et al. | 446/297 |
| 4,570,227 | 2/1986 | Tachi et al. | 364/444 |
| 4,570,250 | 5/1983 | Gabritsos | 369/97 |
| 4,635,136 | 1/1987 | Ciampa et al. | 358/342 |
| 4,636,876 | 6/1987 | Schwartz | 360/32 |
| 4,698,776 | 10/1987 | Shibata | 395/2 |
| 4,750,151 | 6/1988 | Baus | 364/400 |
| 4,772,873 | 9/1988 | Duncan | 395/2 |
| 4,972,350 | 11/1990 | Sander et al. | 369/44.28 |
| 4,989,151 | 1/1991 | Nuimura | 364/449 |
| 5,016,007 | 5/1991 | Iihoshi et al. | 340/995 |
| 5,041,983 | 8/1991 | Nakahura et al. | 364/449 |
| 5,059,126 | 10/1991 | Kimball et al. | 434/308 |

FOREIGN PATENT DOCUMENTS 3535715   4/1987   Fed. Rep. of Germany ......... H04B 14/00

Primary Examiner—David D. Knepper
Attorney, Agent, or Firm—Ladas & Parry

[57] ABSTRACT

Random access solid state memory is used for storing and playing back audio information. Compressed audio information is downloaded to the memory from an audio information source. The operator actuates apparatus for selecting information to be played back from the random access solid state memory.

4 Claims, 15 Drawing Sheets

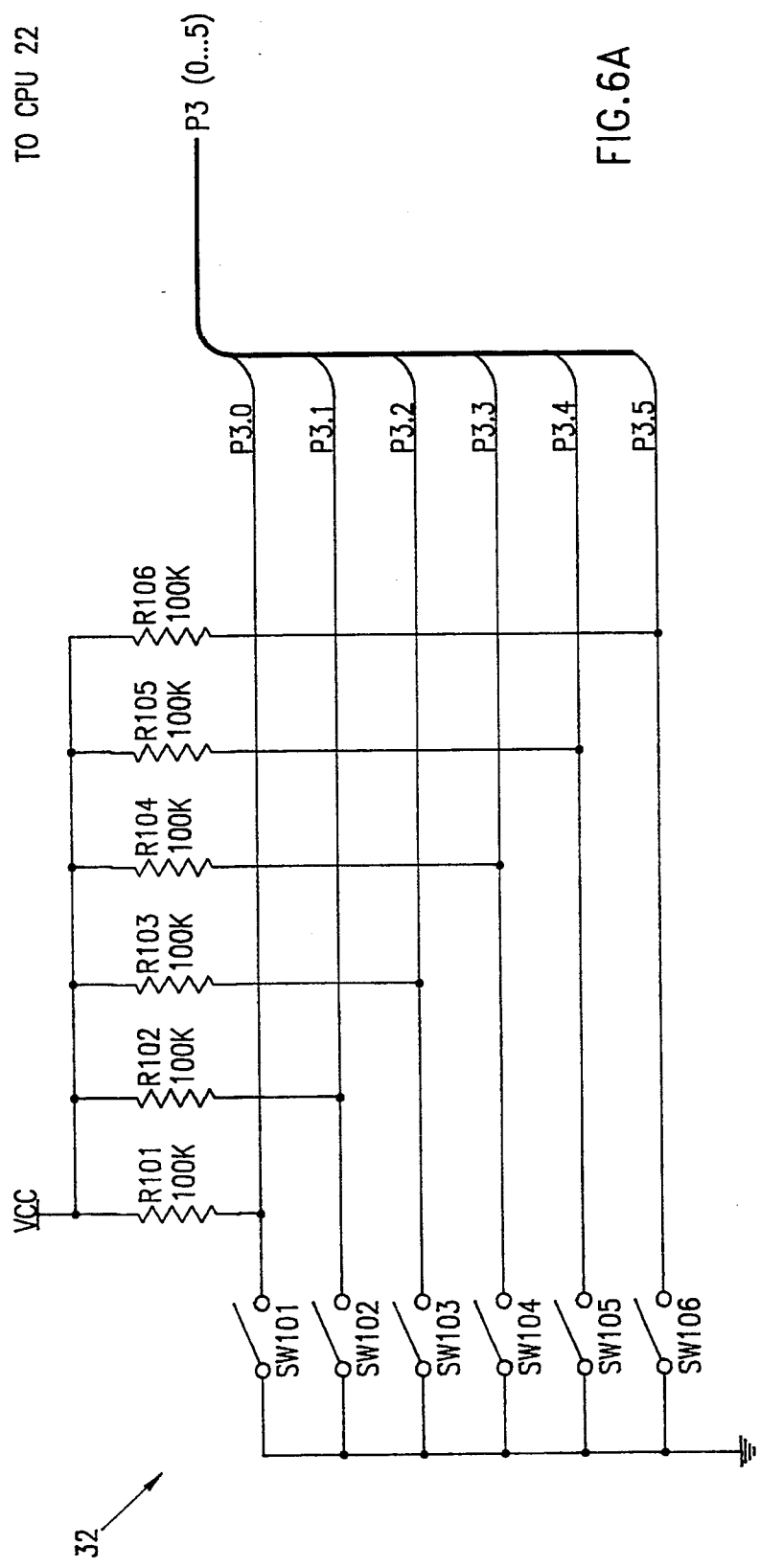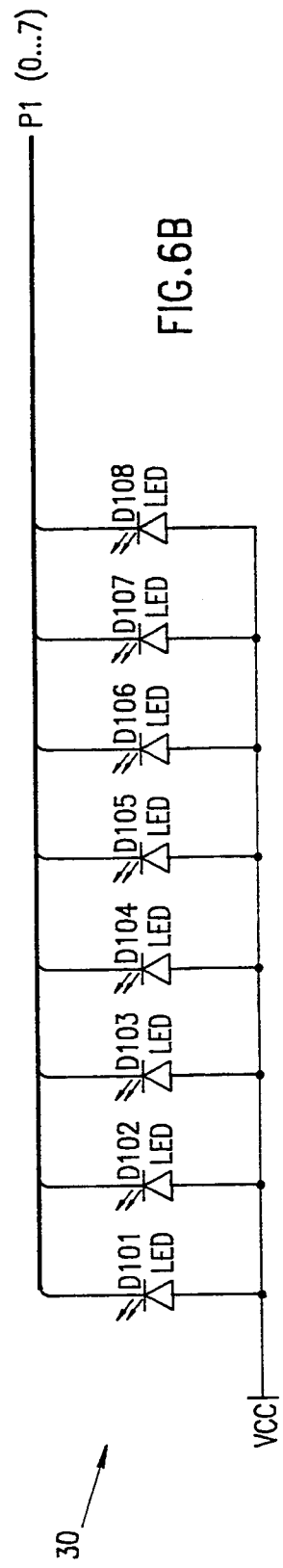
FIG.6A
FIG.6B

PORTABLE RANDOM ACCESS AUDIO RECORDING AND PLAYBACK APPARATUS

FIELD OF THE INVENTION

The present invention relates to random access audio storage and playback apparatus.

BACKGROUND OF THE INVENTION

There presently exists random access audio storage and playback apparatus. One embodiment of such apparatus is a CD ROM which employs a conventional compact disk and disk reader. CD ROMs have a number of disadvantages including their inherent read-only qualities, mechanical complexity and relatively high cost. Portable CD ROM equipment is not presently commercially available.

U.S. Pat. No. 4,636,876 describes the use of speech compression in an audio digital recording and playback system.

U.S. Pat. No. 5,059,126 describes an interactive CD based audio system employing a bar-code reader as a selector input.

SUMMARY OF THE INVENTION

The present invention seeks to provide improved random access audio storage and playback apparatus.

There is thus provided in accordance with a preferred embodiment of the invention portable random access audio recording and playback apparatus comprising a portable enclosure, a random access solid state memory disposed in the enclosure for recording, storing and playing back audio information and operator actuated apparatus for selecting information to be played back.

Further in accordance with a preferred embodiment of the present invention, there is provided apparatus for downloading compressed audio information from an audio information source.

Additionally in accordance with a preferred embodiment of the invention the operator actuated means for selecting information may include code reader apparatus.

Further in accordance with a preferred embodiment of the invention the operator actuated means for selecting information may include wireless information communication apparatus.

Additionally in accordance with a preferred embodiment of the present invention, there is provided apparatus for uploading compressed audio information to audio information utilization apparatus.

BRIEF DESCRIPTION OF THE DRAWINGS

The present invention will be understood and appreciated more fully from the following detailed description, taken in conjunction with the drawings in which:

FIG. 4. is a schematic illustration (NET LIST No. 5, Annex 2) of a preferred embodiment of digital speech processing interface circuitry employed in the apparatus of FIGS. 1 and 2;

FIG. 5 is a schematic illustration (NET LIST No. 1, Annex 2) of a preferred embodiment of CPU circuitry employed in the apparatus of FIGS. 1 and 2;

FIGS. 6A and 6B are schematic illustrations (NET LIST No. 2, Annex 2) of a preferred embodiment of the user interface circuitry employed in the apparatus of FIGS. 1 and 2;

FIG. 8 is a schematic illustration (NET LIST No. 3, Annex 2) of a preferred embodiment of the code reader circuitry employed in the apparatus of FIGS. 1 and 2;

DETAILED DESCRIPTION OF A PREFERRED EMBODIMENT

Figure 1:
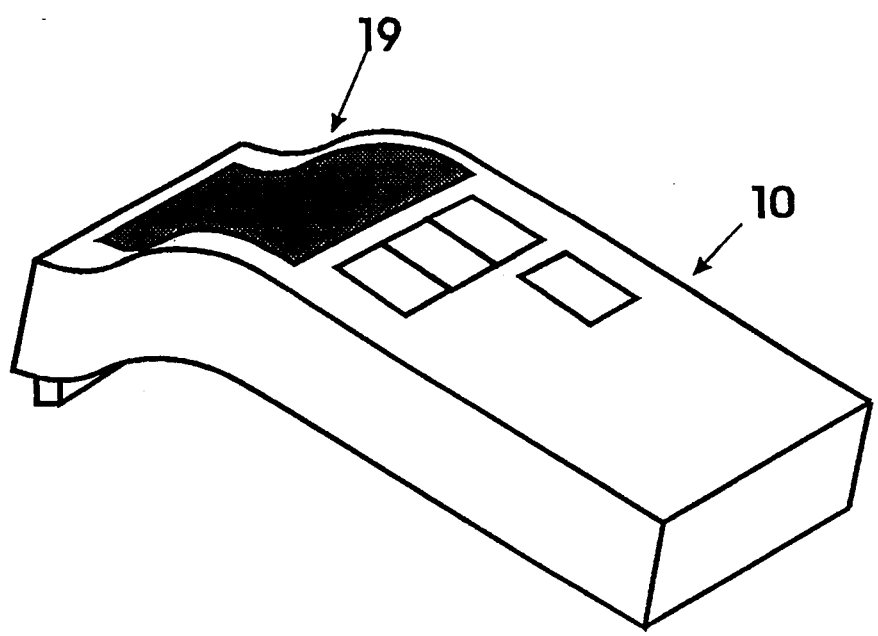
FIG. 1 is a pictorial illustration of portable random access audio recording and playback apparatus constructed and operative in accordance with a preferred embodiment of the present invention.
Figure 2:
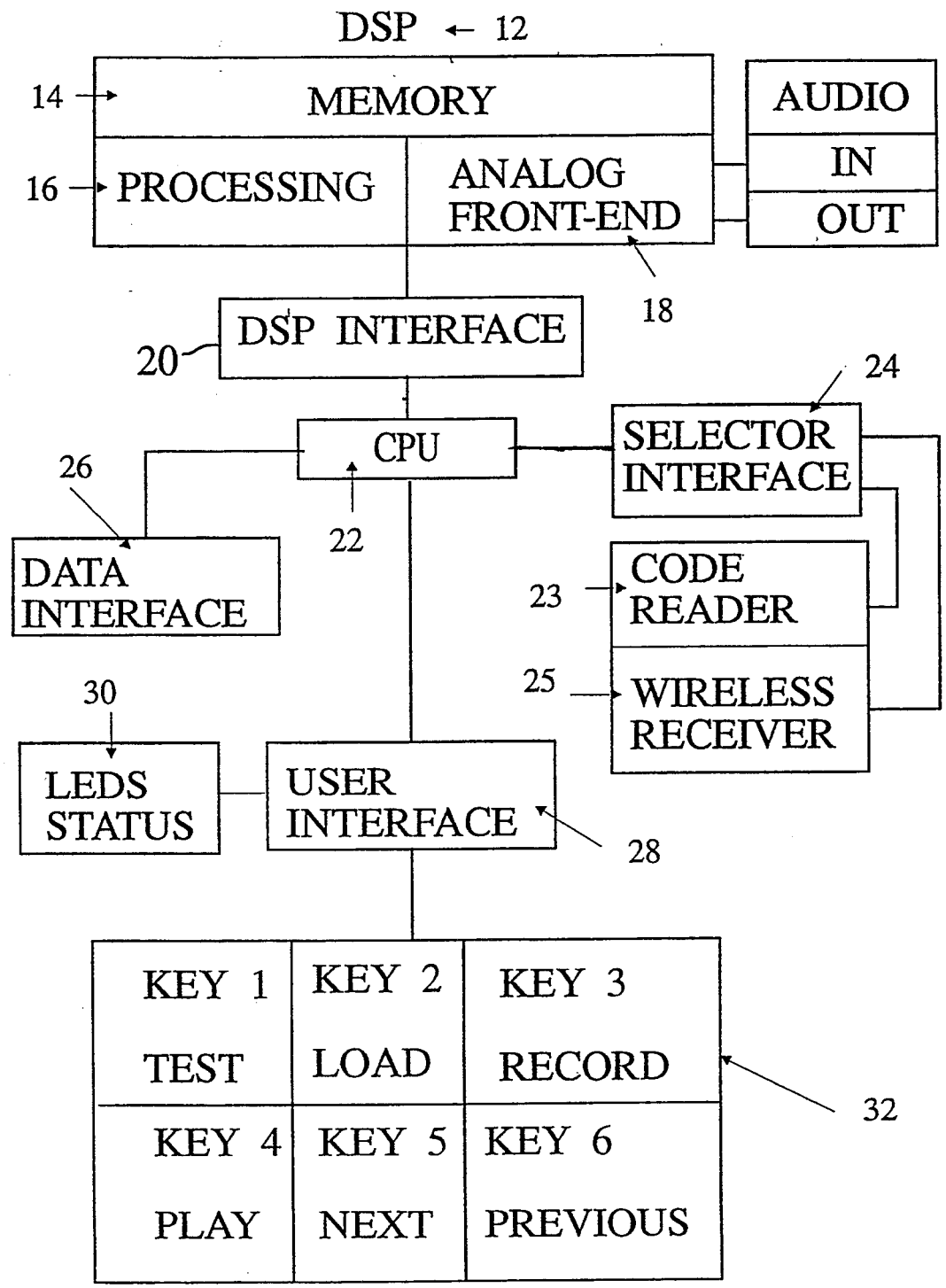
FIG. 2 is a functional block diagram illustration of the apparatus of FIG. 1.

Reference is now made to FIGS. 1 and 2, which illustrate portable random access audio recording and playback apparatus constructed and operative in accordance with a preferred embodiment of the present invention. The apparatus preferably comprises a hand held housing 10 containing digital speech processing (DSP) circuitry 12 including a solid state RAM memory 14, processing circuitry 16 and an analog front end 18 having ports For input and output of audio information, such as via a microphone or loudspeaker 19.

The DSP circuitry 12 communicates via DSP interface circuitry 20 with a CPU 22. The CPU communicates via a selector interface 24 with either or both of a code reader 23 and a wireless receiver 25 For receiving selection inputs, for addressing the solid state RAM memory 14.

Information stored or to be stored in the solid state RAM memory 14 may be up-loaded or down-loaded from an external information storage or supply medium via a data interface 26, which communicates with the CPU 22.

A user interface circuit 28 provides communication between the CPU and a plurality of indicators and input devices, typically including a plurality of LEDs 30 (shown in FIG. 1) and typically 6 single and double action function keys 32, which may have the Functions indicated in FIG. 2.

Figure 3:
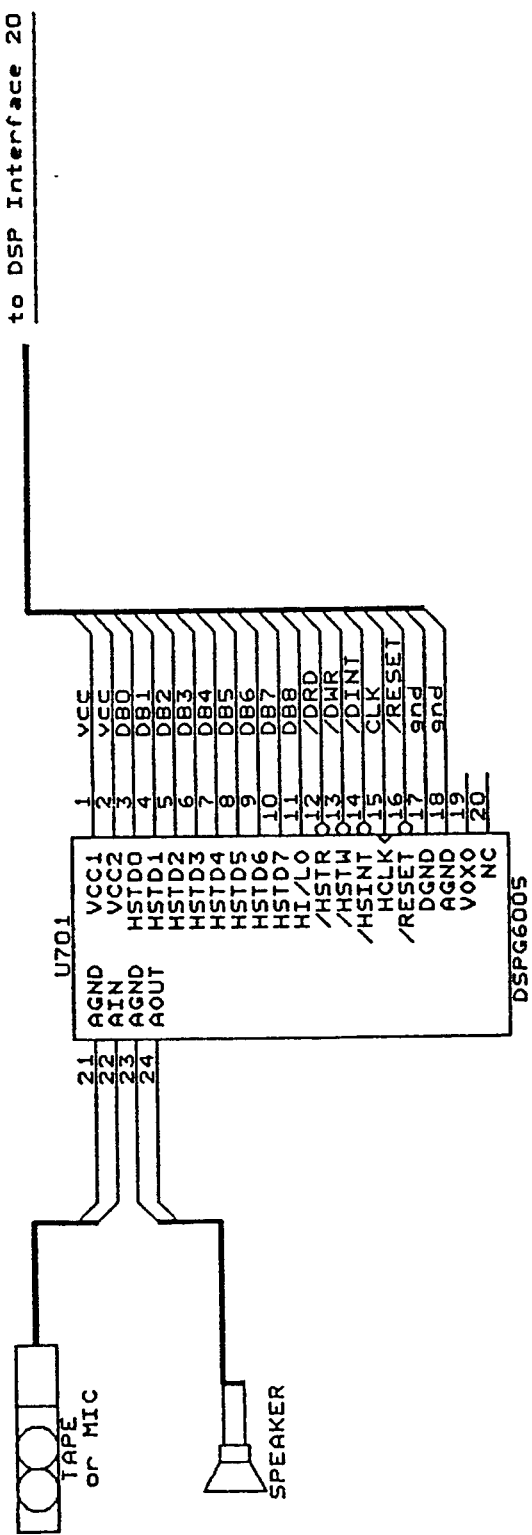
FIG. 3 is a schematic illustration (NET LIST No. 6, Annex 2) of a preferred embodiment of digital speech processing (DSP) circuitry employed in the apparatus of FIGS. 1 and 2.

FIG. 3 (Net List No. 6) is a schematic illustration of a preferred embodiment of digital speech processing circuitry 12 employed in the apparatus of FIGS. 1 and 2, which is based on a DSPG6005 chip commercially available from DSP Group, Inc. and which may communicate with suitable audio input and output devices.

Figure 4A:
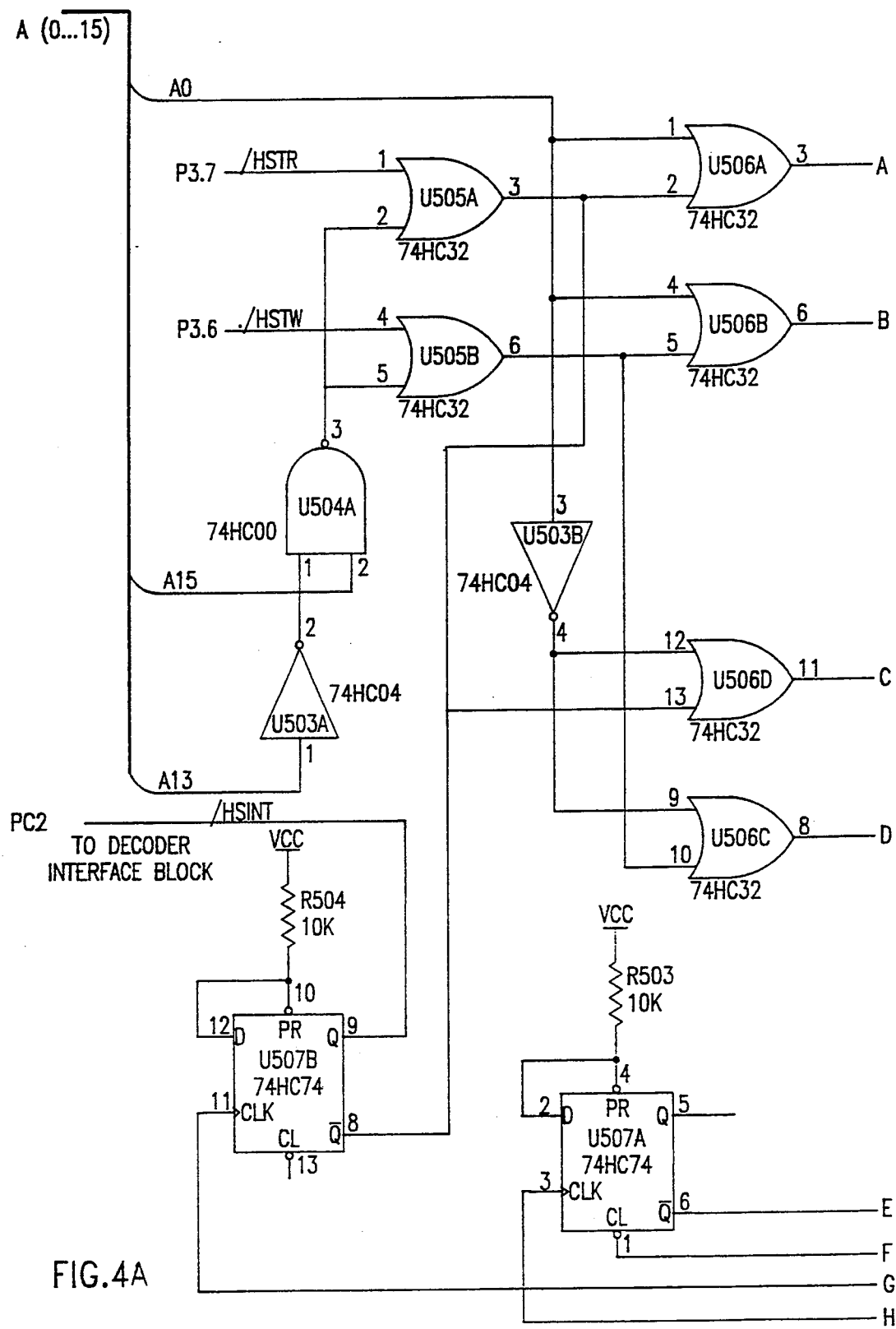
FIGS. 4A and 4B are schematic illustrations.
Figure 4B:
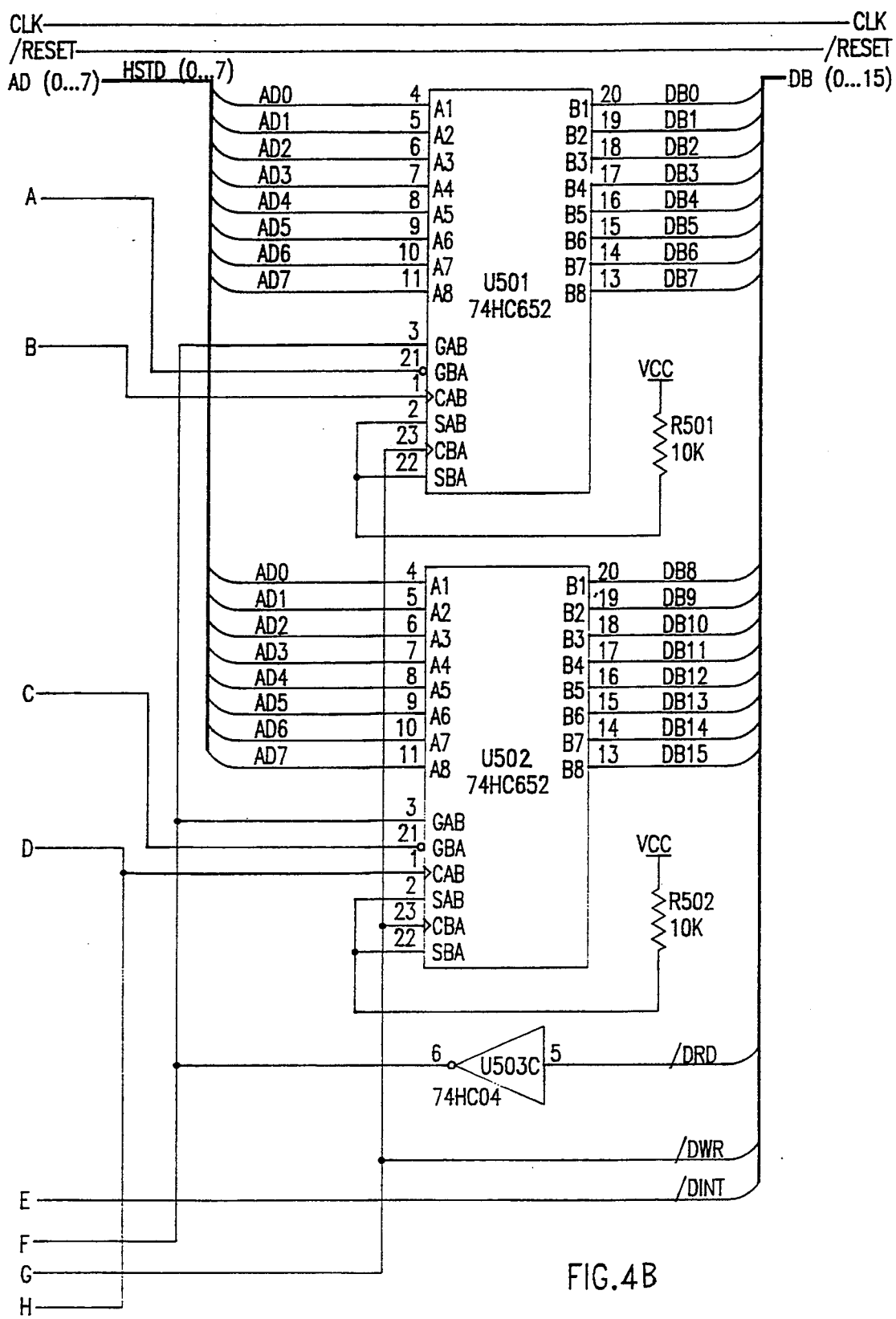

FIGS. 4A and 4B (Net List No. 5) are schematic illustrations of a preferred embodiment of digital speech processing (DSP) interface circuitry 20 employed in the apparatus of FIGS. 1 and 2.

Figure 5A:
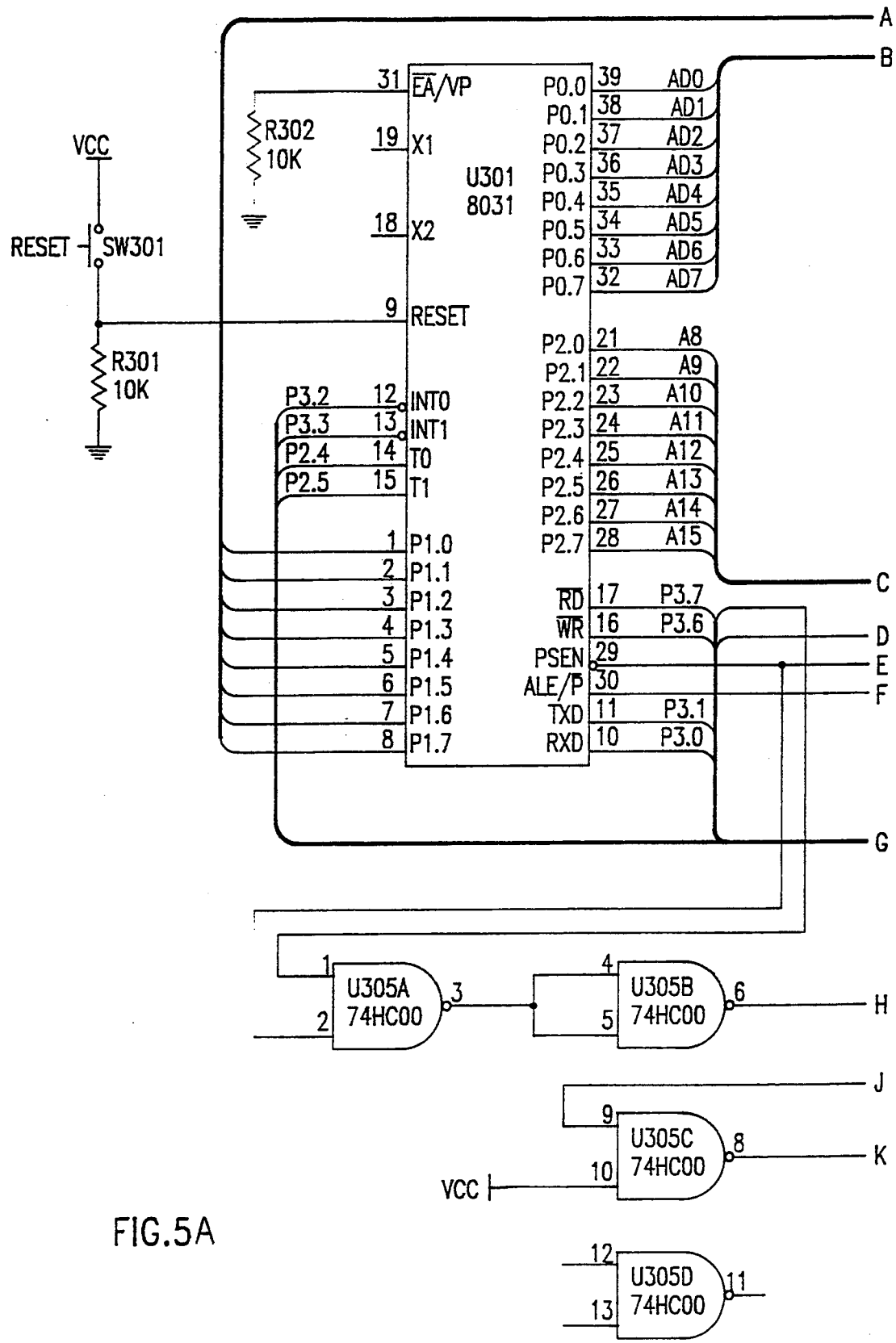
FIGS. 5A and 5B are schematic illustrations.
Figure 5B:
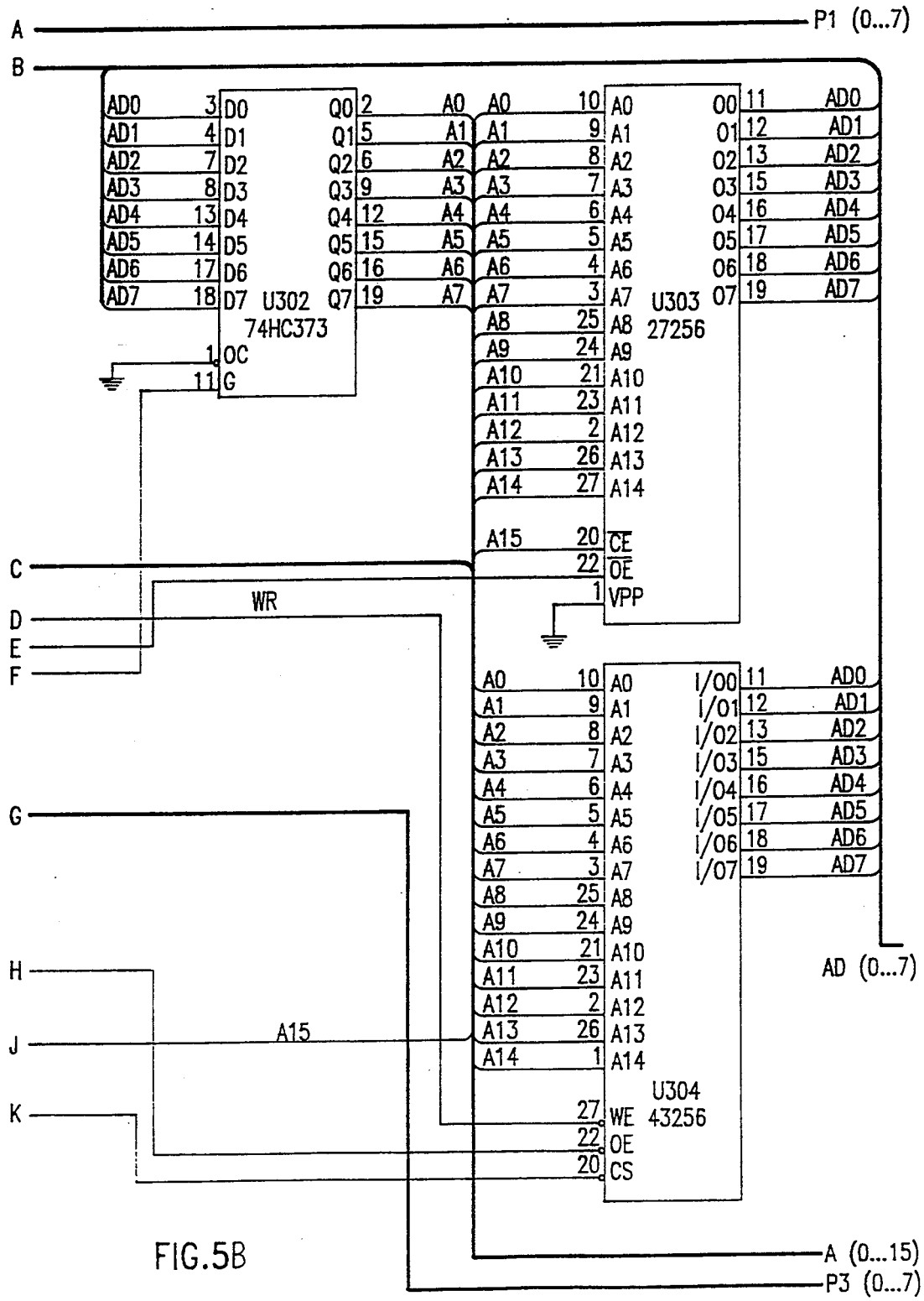

FIGS. 5A and 5B (Net List No. 1) are schematic illustrations of a preferred embodiment of CPU circuitry 22 employed in the apparatus of FIGS. 1 and 2. A listing of preferred operating software residing in the 27256 chip in the CPU circuitry of FIG. 5 appears in Annex I.

FIGS. 6A and 6B (Net List No. 2) are schematic illustrations of a preferred embodiment of the user interface circuitry employed in the apparatus of FIGS. 1 and 2 as well as LEDs 30 and switches 32.

Figure 7:
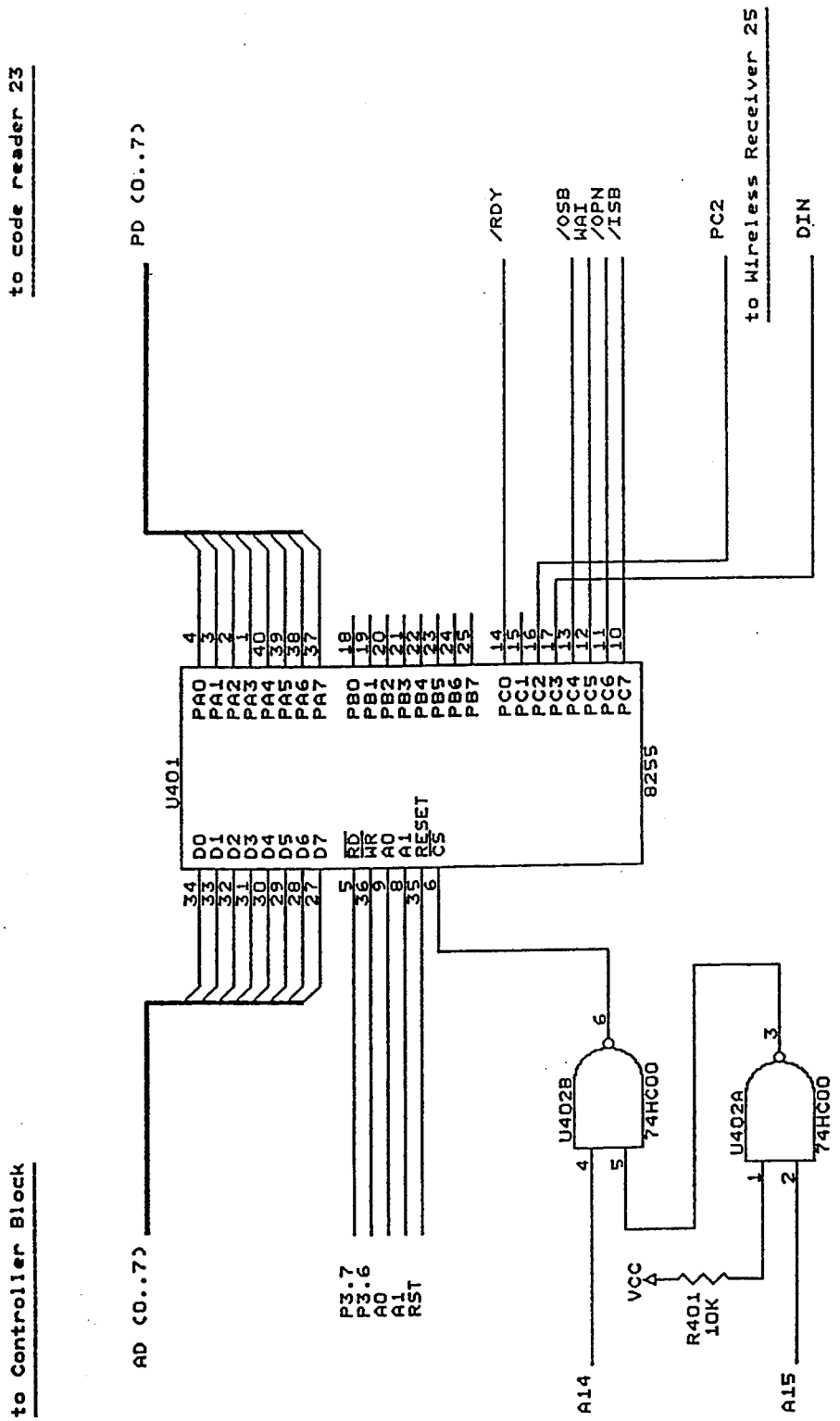
FIG. 7 is a schematic illustration (NET LIST No. 4, Annex 2) of a preferred embodiment of the selector interface circuitry employed in the apparatus of FIGS. 1 and 2.
Figure 8A:
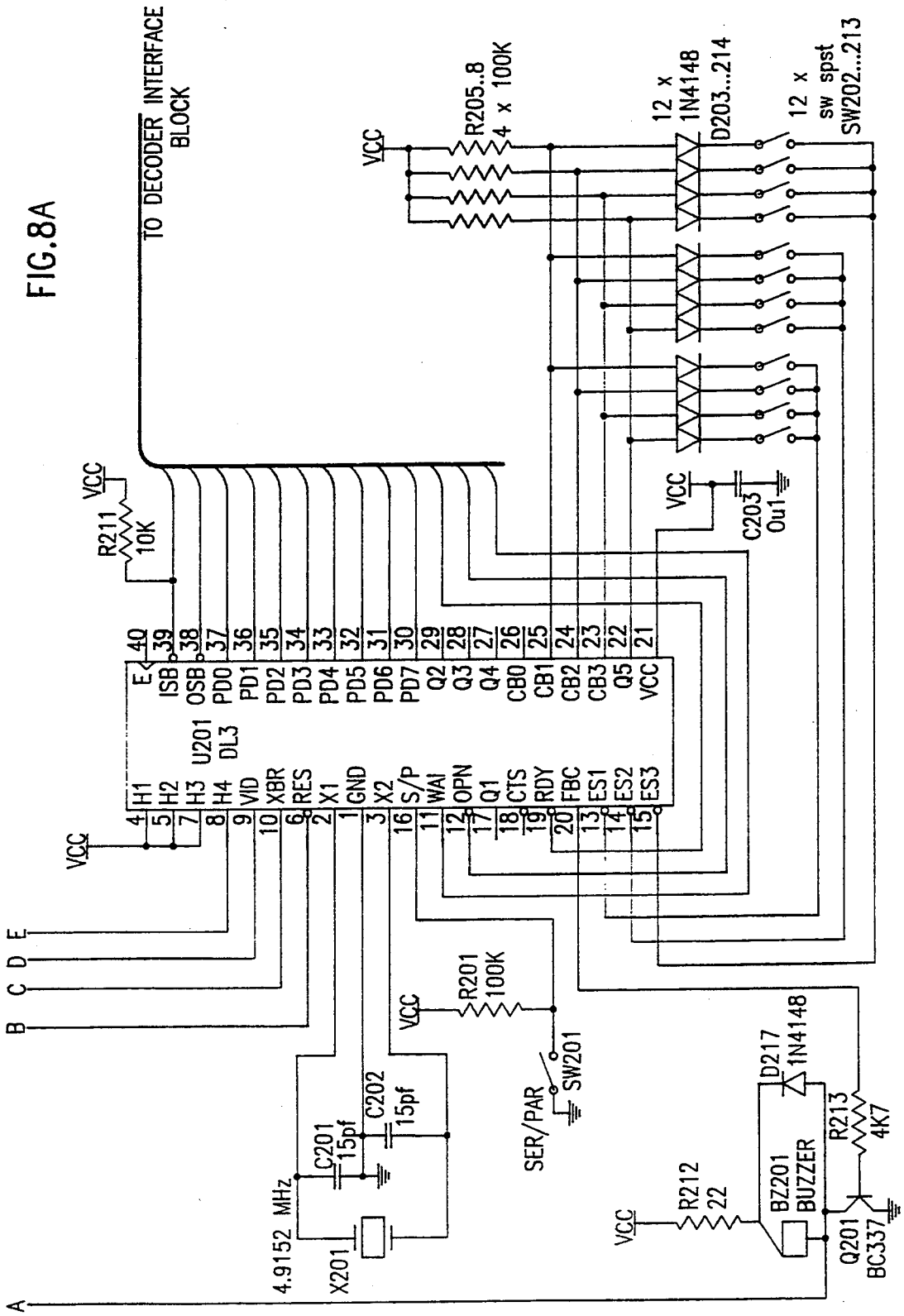
FIGS. 8A and 8B are schematic illustrations.
Figure 8B:
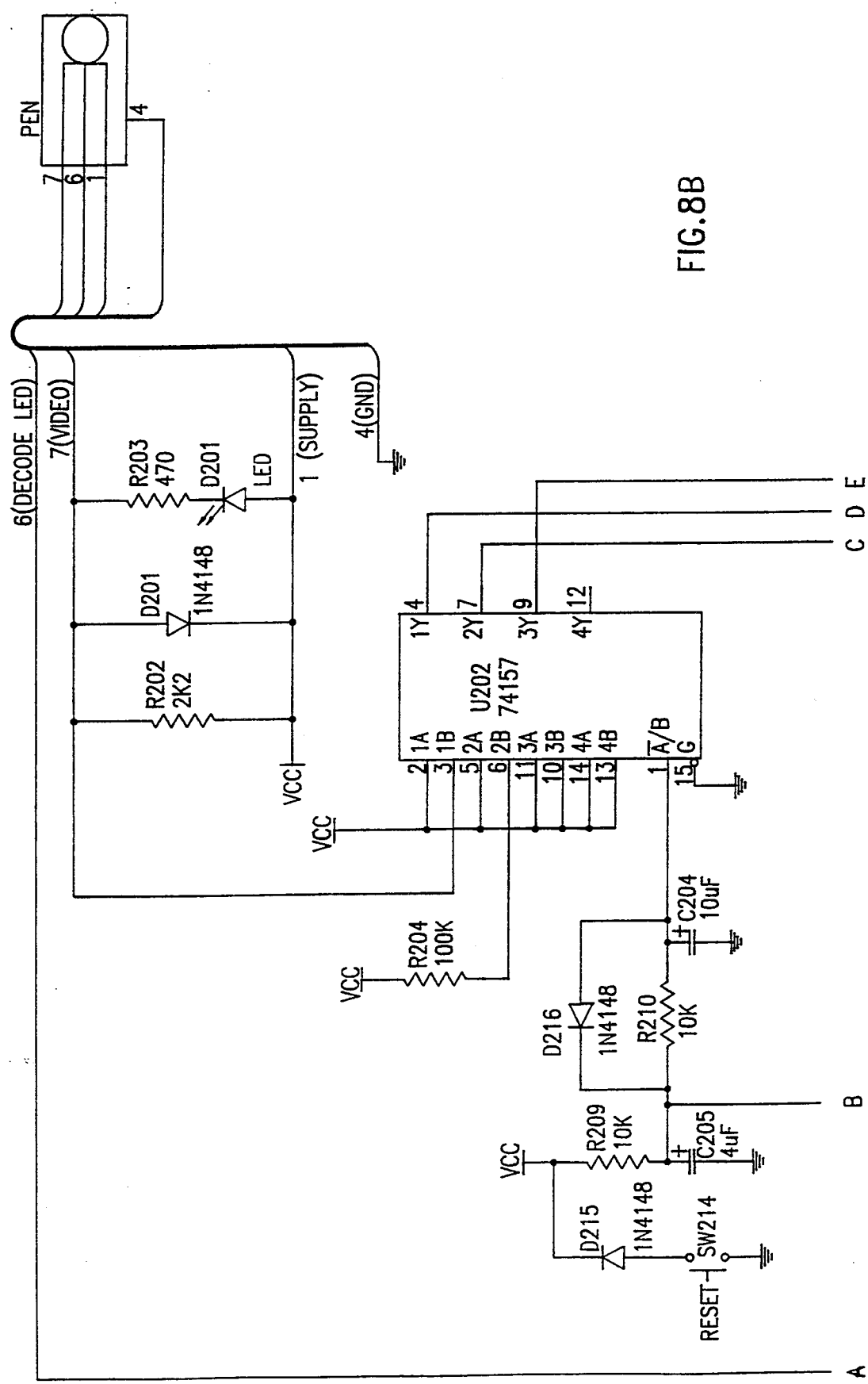

FIG. 7 (Net List No. 4) is a schematic illustration of a preferred embodiment of the selector interface circuitry employed in the apparatus of FIGS. 1 and 2;

FIGS. 8A and 8B (Net List No, 3) are schematic illustrations of a preferred embodiment of the code reader 23 employed in the apparatus of FIGS. 1 and 2.

Net lists of a preferred embodiment of the circuitry of FIG. 2, as shown in the schematic illustrations of FIGS. 3–8, appear in Annex 2.

Figure 9:
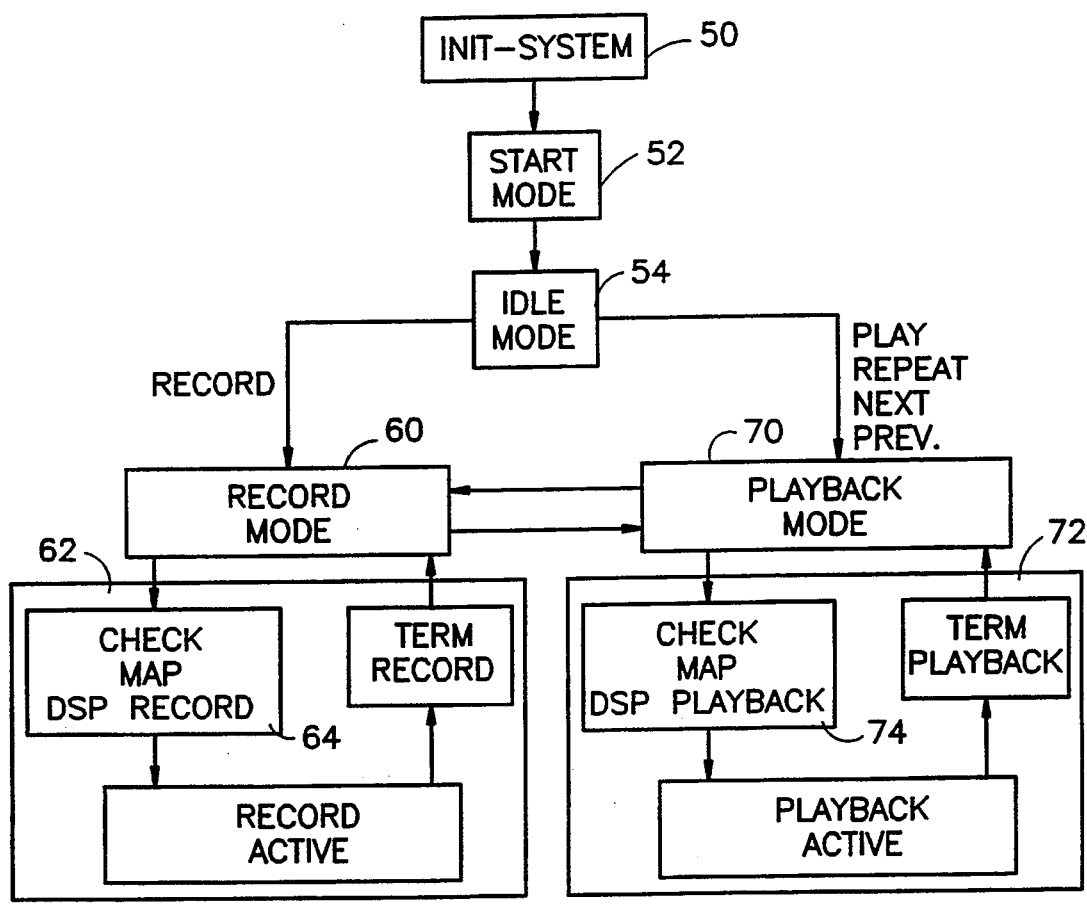
FIG. 9 is a flow chart state diagram illustration of the operation of the apparatus of FIGS. 1-8.

Reference is now made to FIG. 9, which is a flow chart state diagram illustration of the operation of the apparatus of FIGS. 1–8. As envisioned in FIG. 9, the apparatus of the present invention may be employed for any function wherein audio information can be stored in a portable random access memory and then a specific portion thereof may be readily addressed and outputted in a random access mode in response to selection inputs.

The selection inputs may be provided directly by a user, using key inputs 32 (FIG. 2) or alternatively by any suitable selection input device. A preferred device is a code reader 23 (FIG. 2) such as a bar code reader. Such a bar code reader may read codes on a map or guidebook and thus the system may provide corresponding audio information. Similarly, bar codes may be located adjacent individual pictures in a museum and be read to activate a corresponding commentary.

Alternatively wireless commands may provide selection inputs.

It is noted that entry of audio information need not be in the individual units that it is read out or in the same order. Audio information may be supplied to the system via data interface 26 in a conventional manner or directly via audio inputs to the analog front end 18 of the DSP circuitry 12 (FIG. 2).

As seen in FIG. 9, system initialization 50 is followed by start 52 and idle 54 modes which may alternate with record 60 and playback 70 modes, each of which has its internal subroutines 62 and 72 respectively including check functions 64 and 74.

Figure 10:
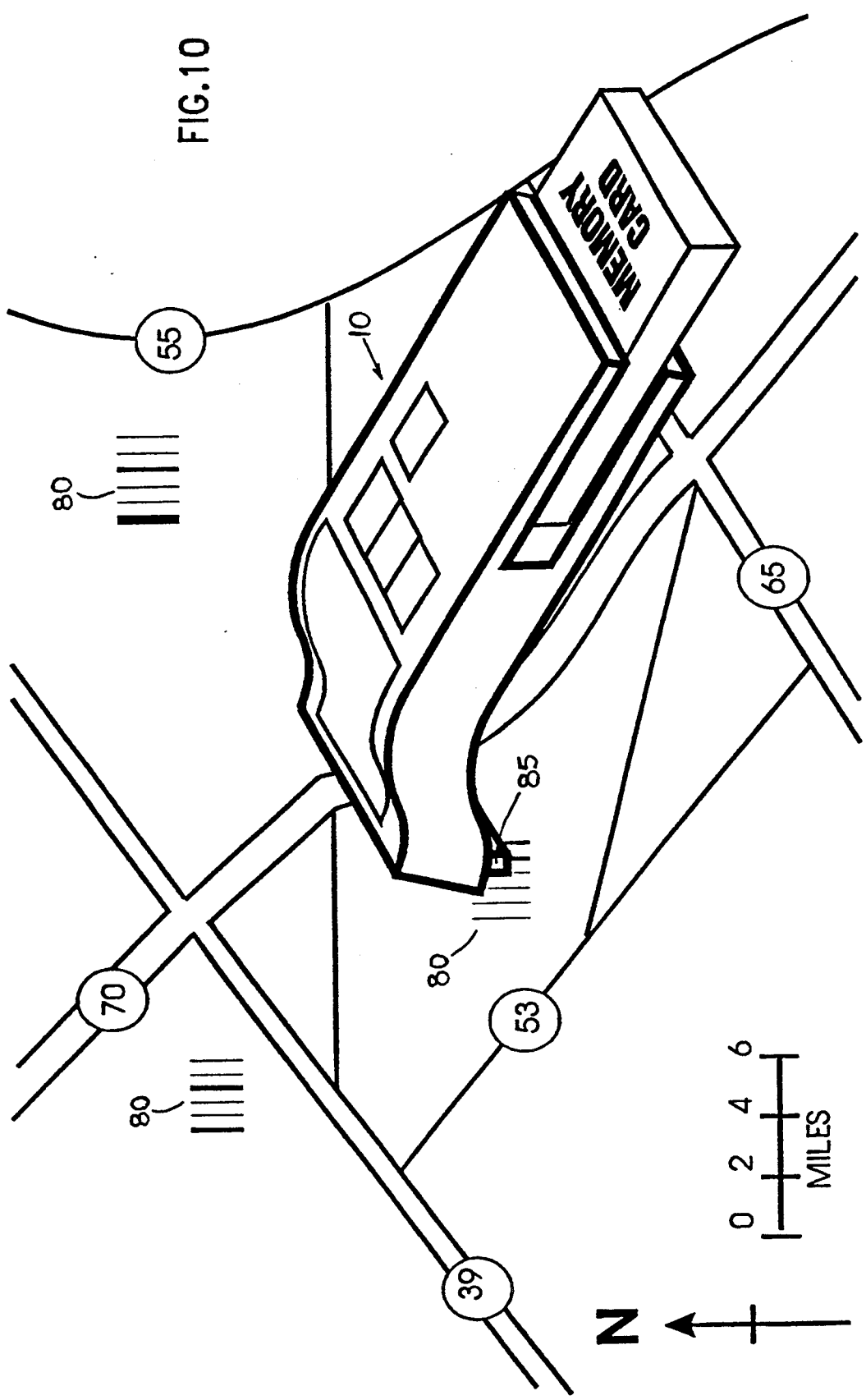
FIG. 10 illustrates the use of the system with a map bearing bar codes.

FIG. 10 illustrates the use of the system together with a map bearing bar codes 80 which are read by a code reader 85 mounted in housing 10 to provide audio information corresponding to a location identified by the bar code which is read.

Figure 11:
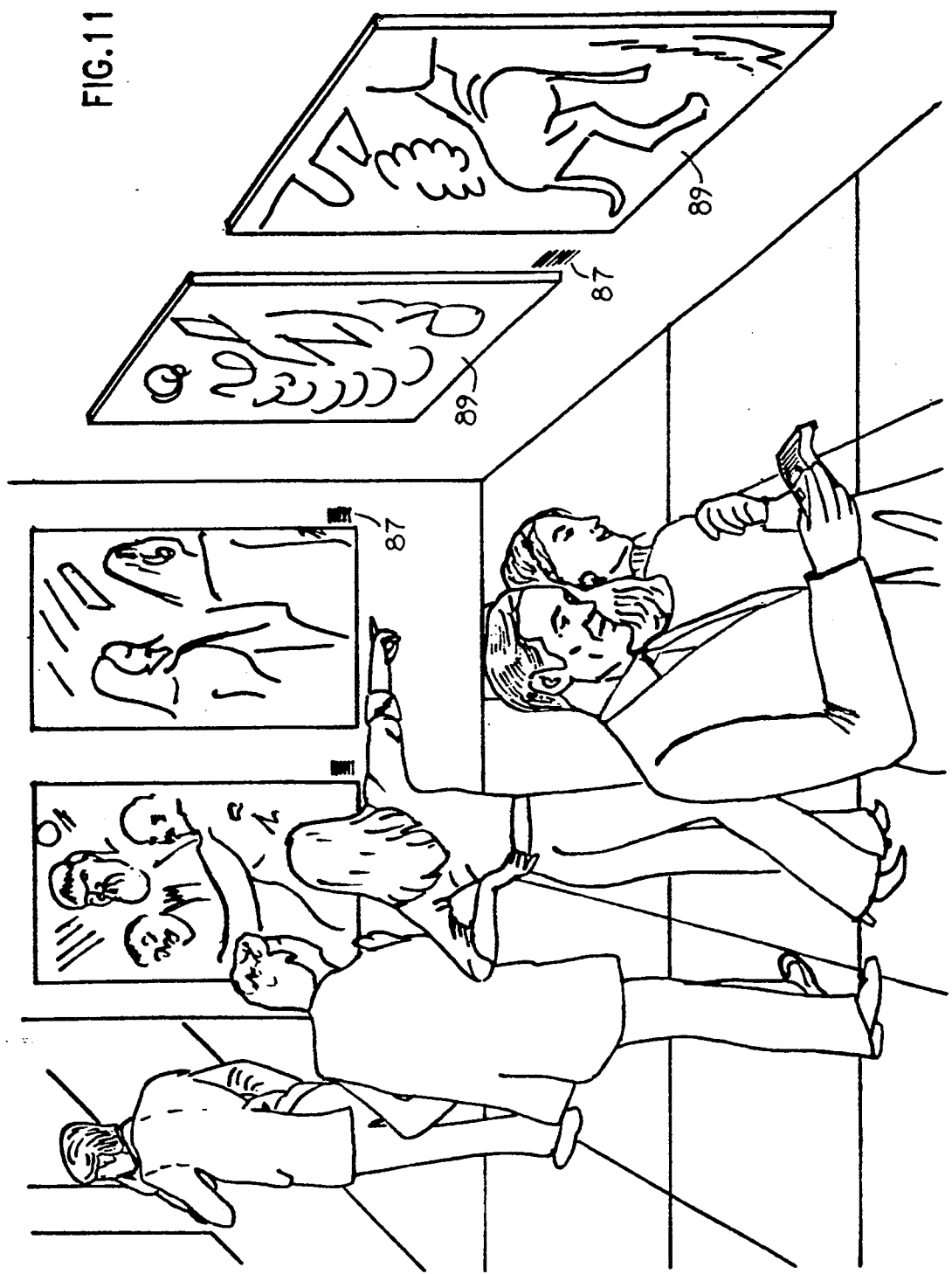
FIG. 11 illustrates the use of the system in a museum context.

FIG. 11 illustrates the use of the system in a museum environment wherein bar codes 87 may be placed alongside individual pictures.

Figure 12:
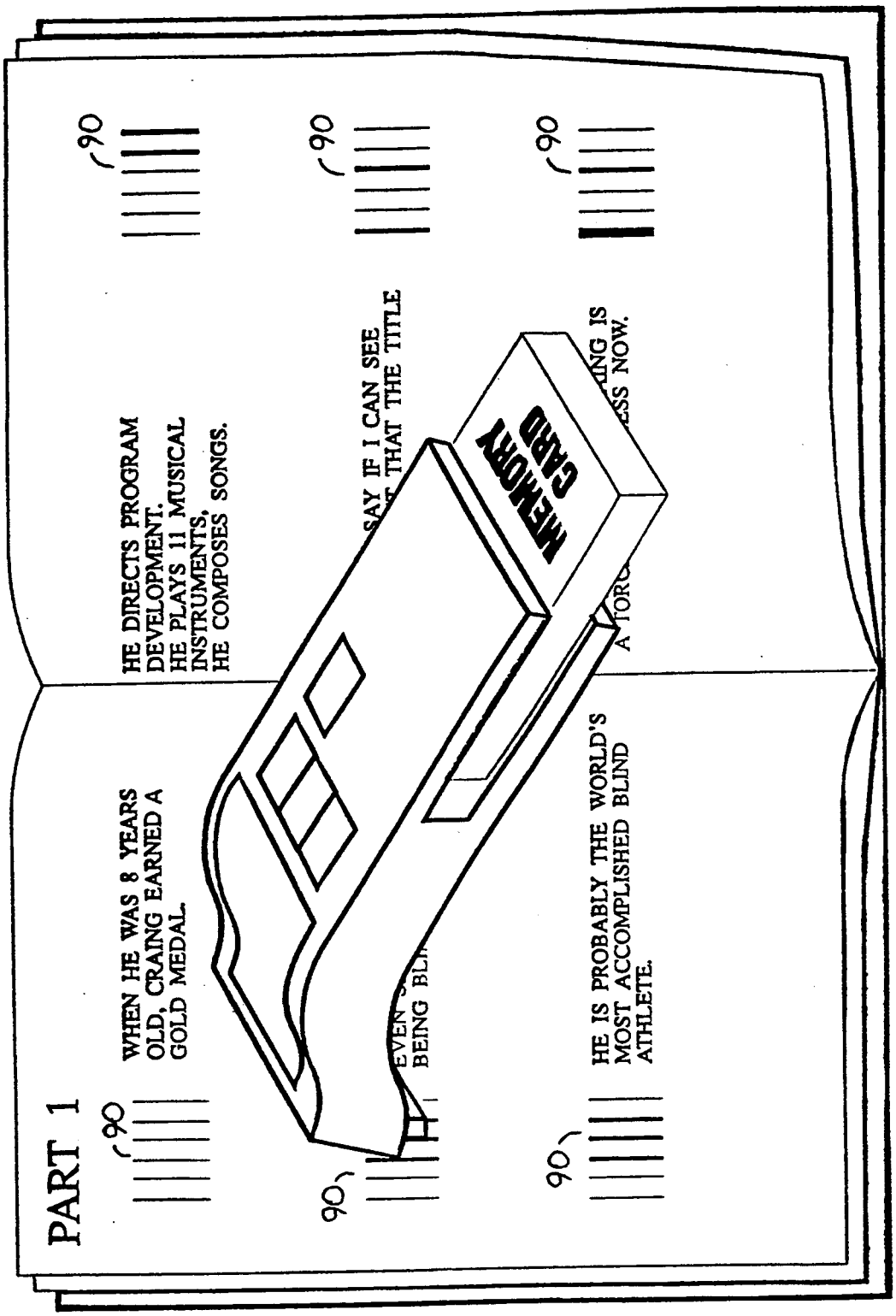
FIG. 12 illustrates the use of the system in language study.

FIG. 12 illustrates the use of the system in language study, wherein the bar codes may be placed alongside individual paragraphs, sentences, words or pictures.

It is appreciated that the system of the invention may have a fixed memory which can be loaded as convenient or alternatively may be provided with modular replaceable memory modules. In either embodiment, the system may be usable for multiple environments, such as both museums and maps. It can also be used by itself as a dictating/transcribing machine that enables creating of documents in a random order (replace/insert/delete/record segments).

It will be appreciated by persons skilled in the art that the present invention is not limited by what has been particularly shown and described hereinabove. Rather the scope of the present invention is defined only by the claims which follow:

We claim:

1. Portable random access audio recording and playback apparatus comprising:
   a hand held enclosure;
   a random access solid state memory disposed in the enclosure for storing and playing back audio information;
   means, disposed within said enclosure, for receiving analog audio information and supplying it to said random access solid state memory is compressed digital form;
   said random access solid state memory being operative for recording and storing said analog audio information in compressed digital form,
   a data interface disposed in said hand held enclosure for downloading compressed audio information to said random access solid state memory from an external audio information source and for uploading said analog audio information in compressed digital form from said random access solid state memory to an external information storage medium,
   operator actuated means for selecting information to be played back from said random access solid state memory, and
   audio output means for providing an audio output of selected audio information.

2. Apparatus according to claim 1 and wherein said operator actuated means for selecting information include code reader apparatus.

3. Apparatus according to claim 2 and wherein said operator actuated means for selecting information includes wireless information communications means.

4. Apparatus according to claim 1 and wherein said operator actuated means for selecting information includes wireless information communication means.

* * * * *